US007330346B2

(12) United States Patent
Ikuhara et al.

(10) Patent No.: US 7,330,346 B2
(45) Date of Patent: Feb. 12, 2008

(54) ETCHING APPARATUS, METHOD FOR MEASURING SELF-BIAS VOLTAGE, AND METHOD FOR MONITORING ETCHING APPARATUS

(75) Inventors: Shoji Ikuhara, Hikari (JP); Hideyuki Yamamoto, Kudamatsu (JP); Daisuke Shiraishi, Hikari (JP); Akira Kagoshima, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/506,791

(22) Filed: Aug. 21, 2006

(65) Prior Publication Data

US 2007/0217118 A1    Sep. 20, 2007

(30) Foreign Application Priority Data

Mar. 1, 2006  (JP) .............................. 2006-054913

(51) Int. Cl.
*H02N 13/00* (2006.01)
(52) U.S. Cl. ...................... 361/234; 118/712; 118/713; 118/714; 216/59; 324/765
(58) Field of Classification Search ................ 361/234
See application file for complete search history.

(56) References Cited

U.S. PATENT DOCUMENTS

| 5,557,215 | A  | * | 9/1996 | Saeki et al. ................. 324/765 |
| 6,243,251 | B1 | * | 6/2001 | Kanno et al. ................ 361/234 |
| 6,255,223 | B1 | * | 7/2001 | Matsuda et al. ............. 438/716 |
| 6,273,023 | B1 | * | 8/2001 | Tsuchihashi et al. ....... 118/723 E |
| 2006/0065623 | A1 | * | 3/2006 | Guiney et al. ................ 216/59 |

FOREIGN PATENT DOCUMENTS

JP        2002-252276        9/2002

\* cited by examiner

*Primary Examiner*—Michael Sherry
*Assistant Examiner*—Lucy Thomas
(74) *Attorney, Agent, or Firm*—Antonelli, Terry, Stout & Kraus, LLP.

(57) ABSTRACT

The invention provides a means for estimating a self-bias voltage under arbitrary etching conditions via a simple procedure. The present invention provides a method for measuring self-bias voltage of an etching apparatus comprising an electrostatic chuck mechanism 1 and 10 for chucking a sample 2, a mechanism 13 and 14 for supplying cooling gas 12 to a rear surface of the sample 2 and controlling the pressure thereof, and a means for measuring the relative force of electrostatic chuck of the sample based on the rear surface pressure control status of the sample 2 being processed, wherein the relative force of electrostatic chuck of the sample and the electrostatic chuck voltage corresponding to the force of electrostatic chuck are acquired based on the rear surface pressure control of the sample 2 when high-frequency bias power is applied to the sample 2 being processed, and the relative force of electrostatic chuck of the sample and the electrostatic chuck voltage corresponding to the force of electrostatic chuck are acquired based on the rear surface pressure control status of the sample when high-frequency bias power is not applied to the sample being processed, and the self-bias voltage is estimated using the acquired forces of electrostatic chuck and the electrostatic chuck voltages corresponding to the two statuses.

12 Claims, 6 Drawing Sheets

ETCHING APPARATUS, METHOD FOR MEASURING SELF-BIAS VOLTAGE, AND METHOD FOR MONITORING ETCHING APPARATUS

The present application is based on and claims priority of Japanese patent application No. 2006-54913 filed on Mar. 1, 2006, the entire contents of which are hereby incorporated by reference.

BACKGROUND OF THE INVENTION

1. Field of the Invention

The present invention relates to the art of controlling processes of semiconductor manufacturing apparatuses.

2. Description of the Related Art

In a dry etching process included in the steps for manufacturing semiconductor devices, high-frequency power is applied to an electrode on which the substrate to be processed in the etching apparatus is placed. The high-frequency power is applied via a capacitor, and since more electrons than ions are injected to the electrode due to the differences in the speed of electrons and ions in the plasma, the potential of the electrode becomes negative. The difference between the potential of the electrode and the ground level is called a self-bias voltage. The self-bias voltage enables the ion components in the plasma to be accelerated and injected to the substrate, by which the etching process is promoted.

In other words, though the occurrence of self-bias voltage is inevitable for the etching process, too much voltage may damage the substrate, so it is necessary to set an appropriate self-bias voltage for the etching process.

As described, in the dry etching process included in the steps for manufacturing semiconductor devices, it is necessary to set the self-bias voltage to an appropriate value, but in order to do so, it is necessary to measure the self-bias voltage first. On the other hand, recent etching apparatuses adopt electrostatic chuck mechanisms for holding and cooling the substrate on the electrode.

The electrode equipped with an the electrostatic chuck mechanism has a thin insulating film formed on the surface of the electrode, and DC voltage is applied via the insulating film so as to polarize the insulating film and support the substrate (sample) via the coulomb force by the charge generated between the substrate and the electrode. If the electrode is not equipped with such electrostatic chuck mechanism, the self-bias voltage of the processing substrate can be obtained by measuring the potential of the electrode itself. However, if the electrode is equipped with the above-mentioned electrostatic chuck mechanism, the self-bias voltage cannot be acquired directly from the potential of the electrode, since the resistance of the insulating film is too large.

Therefore, in an etching apparatus utilizing an electrode having an electrostatic chuck mechanism, an additional operation was necessary to measure the self-bias voltage in advance using an electrode having no insulating film just for measuring the self-bias voltage, and then to estimate the self-bias voltage under similar etching conditions.

Japanese Patent Number 3635463 (patent document 1) discloses a plasma processing apparatus capable of measuring a self bias voltage of the object to be processed accurately in a short time and hold the object stably with the required force of electrostatic chuck, providing a circular electrostatic chuck sheet 30 crowned on the upper surface of a mounting stage provided at the center of a processing chamber, with a semiconductor wafer mounted on the electrostatic chuck sheet. The electrostatic chuck sheet is constituted by sealing a thin conducting film formed for example of a copper coil as an electrode for electrostatic chuck between a thin film formed for example of SiC and an insulating film formed for example of polyimide. The thin conducting film is connected to the output terminal of a variable DC power supply through an ammeter, and the ammeter detects the leaking current between the semiconductor wafer and the conducting film, outputting the variable DC voltage under the control of a control unit and the variable DC power supply.

According to the prior art plasma processing apparatus, however, the self-bias voltage Vsb is measured from the leaking current flowing through the electrostatic chuck sheet, which is theoretically possible, but the accurate self-bias voltage can only be acquired if the quality of the insulating film for electrostatic chuck is stable and uniform as a premise. Actually, the absolute value of the leaking current is very small, and the film thickness and quality of the electrostatic chuck sheet are not uniform, so that the SN ratio of the measurement is too small. Therefore, this method is not practical. Even further, since the atmosphere within the processing chamber varies by time and the status of the chuck fluctuates, it is difficult to measure the leaking current in a stable manner. Moreover, if the insulating film is composed of ceramic that does not have a leaking current, it is basically not possible to measure the self-bias voltage according to this method.

SUMMARY OF THE INVENTION

With respect to the problems in measuring the self-bias voltage in an etching apparatus having electrostatic chuck electrode according to the prior art, the present invention aims at providing a method for measuring a self-bias voltage of an etching apparatus, an etching apparatus, and a method for monitoring the etching apparatus capable of estimating the self-bias voltage under arbitrary etching conditions via a simple process, so as to optimize the etching conditions.

Moreover, the present invention aims at preventing defects from occurring during mass production by facilitating estimation of fluctuation of the self-bias voltage that affects the etching performance.

The substrate (sample) being subjected to electrostatic chuck is cooled by the cooling gas, and in order to realize a constant cooling effect, the pressure of the cooling gas is controlled. In other words, this control is aimed at maintaining a constant ratio between the quantity of cooling gas flowing into the rear surface of the substrate and the quantity of leak therefrom, and this quantity of leak is increased or decreased depending on the force of electrostatic chuck. Therefore, the force of electrostatic chuck can be estimated by monitoring the control parameters such as the quantity of cooling gas flowing in, the opening of the pressure control valve, the control cycles and the like during pressure control. Since the self-bias voltage is a DC component, the self-bias voltage is superposed to the electrostatic chuck voltage, and it contributes to increasing the force of electrostatic chuck. Therefore, by measuring the forces of electrostatic chuck for the cases in which high-frequency power is applied and in which no high-frequency power is applied, it becomes possible to estimate the self-bias voltage since the difference between the forces of electrostatic chuck is caused by self-bias.

In order to solve the problems mentioned above, the present invention provides a method for measuring self-bias voltage in an etching apparatus comprising an electrostatic chuck mechanism for chucking a sample, a mechanism for filling a cooling gas to a rear surface of the sample subjected to electrostatic chuck and controlling the pressure of the cooling gas, and a means for measuring a relative force of electrostatic chuck of the sample based on a status of control of the rear surface pressure of the sample during processing, the method comprising acquiring the relative force of electrostatic chuck of the sample and the electrostatic chuck voltage corresponding to the force of electrostatic chuck based on the status of control of the rear surface pressure of the sample when high-frequency bias power is applied to the sample during processing; acquiring the relative force of electrostatic chuck of the sample and the electrostatic chuck voltage corresponding to the force of electrostatic chuck based on the status of control of the rear surface pressure of the sample when high-frequency bias power is not applied to the sample during processing; and estimating the self-bias voltage applied to the sample via the high-frequency bias power using the acquired forces of electrostatic chuck and the electrostatic chuck voltages corresponding to the forces of electrostatic chuck of both statuses.

Moreover, the present invention provides the method for measuring self-bias voltage mentioned above, further comprising estimating the self-bias voltage with the high-frequency bias power applied by computing the difference between electrostatic chuck voltages at a point where the acquired forces of electrostatic chuck are equal for both statuses. Furthermore, the present invention provides the method for measuring self-bias voltage mentioned above, comprising acquiring the force of electrostatic chuck for chucking the sample by the electrostatic chuck mechanism based on the flow rate of the cooling gas supplied to the rear surface of the sample, or based on the pressure of the cooling gas supplied to the rear surface of the sample.

The present invention also provides a method for monitoring an etching apparatus, comprising acquiring a plurality of estimated self-bias voltages of the sample estimated by the above-mentioned method for measuring self-bias voltage, and monitoring the status of the etching apparatus based on the transition thereof.

The present invention also provides an etching apparatus comprising an electrostatic chuck mechanism for chucking a sample, a mechanism for filling a cooling gas to a rear surface of the sample subjected to electrostatic chuck and controlling the pressure thereof, a means for acquiring a relative force of electrostatic chuck of the sample and the electrostatic chuck voltage corresponding to the force of electrostatic chuck based on a status of control of the rear surface pressure of the sample during processing, and a means for estimating the self bias voltage applied to the sample via the high-frequency bias power, using the respectively acquired electrostatic chuck voltages corresponding to the same force of electrostatic chuck respectively acquired by applying high-frequency bias power to the sample and acquired by not applying high-frequency bias power thereto.

Moreover, the present invention provides an etching apparatus comprising an electrostatic chuck mechanism for chucking a sample, mechanism for filling a cooling gas to a rear surface of the sample subjected to electrostatic chuck and controlling the pressure thereof, a means for acquiring a relative force of electrostatic chuck of the sample and the electrostatic chuck voltage corresponding to the force of electrostatic chuck based on a status of control of the rear surface pressure of the sample during processing, a means for estimating the self bias voltage applied to the sample via the high-frequency bias power, using the electrostatic chuck voltages corresponding to the same force of electrostatic chuck respectively acquired by applying high-frequency bias power to the sample and acquired by not applying high-frequency bias power thereto, and a means for monitoring the status of the etching apparatus based on the transition of self-bias voltages respectively estimated for a plurality of samples.

According to the present invention, it becomes possible to estimate the self-bias voltage under arbitrary etching conditions via a simple process, so the etching conditions can be optimized easily. Furthermore, since the fluctuation of self-bias voltage affects the etching performances, the present invention can be applied to mass-production to prevent occurrence of defective products.

DETAILED DESCRIPTION OF THE PREFERRED EMBODIMENTS

Figure 1:
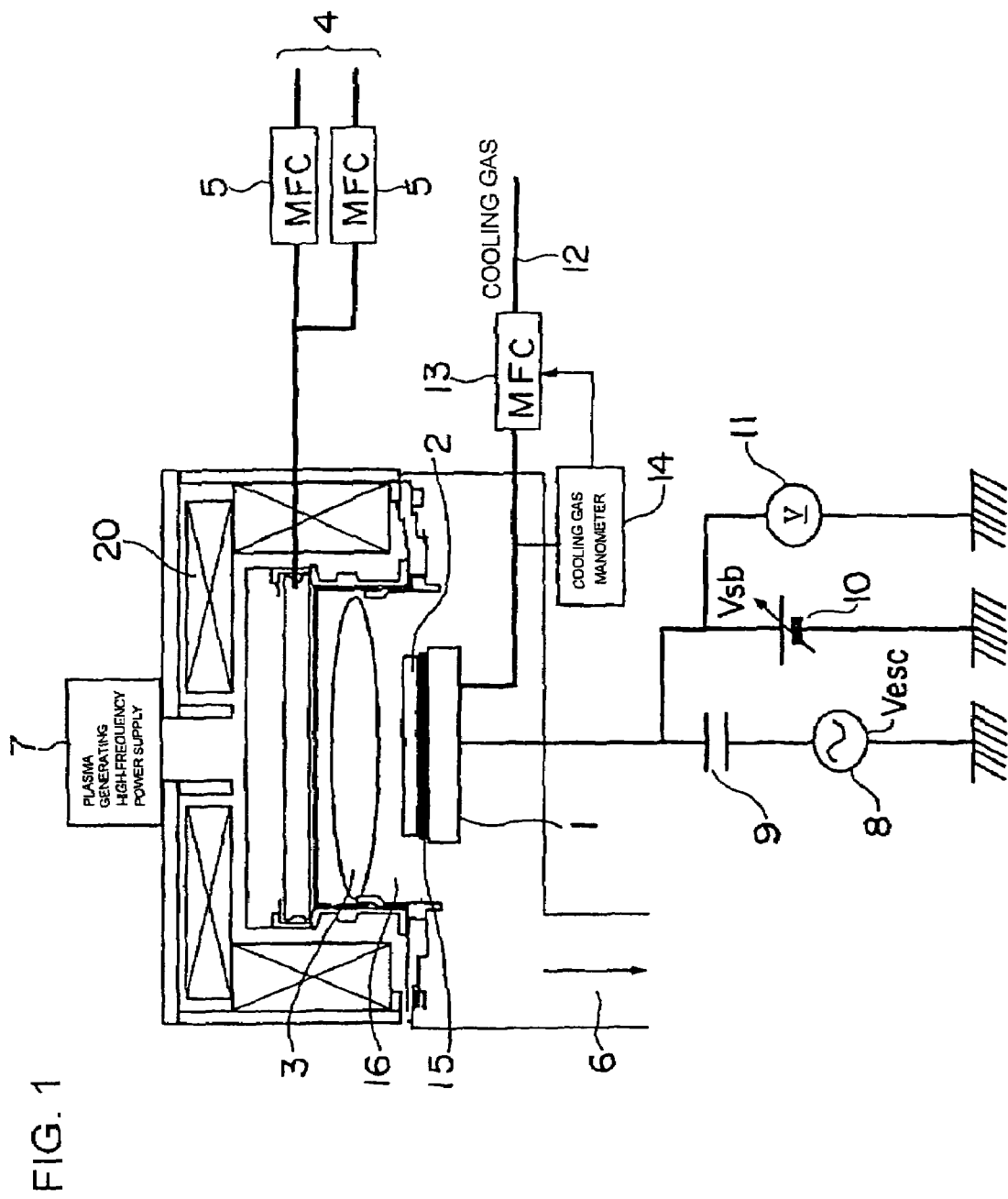
FIG. 1 is a view illustrating the outline of the arrangement of an etching apparatus to which the present invention is applied.

FIG. 1 is referred to in describing the configuration of an etching apparatus to which the present invention is applied. The etching apparatus has a wafer (sample) 2 placed on an electrode 1 disposed in a processing chamber, and generates plasma 3 to subject the wafer to etching. In further detail, a process gas from a gas supply system 4 controlled to a constant flow rate via a mass flow controller 5 is supplied to a processing chamber 16, and discharged from the chamber via an exhaust system 6. While controlling the interior of the processing chamber 16 to an appropriate pressure, high-frequency power for generating plasma is applied from a plasma generating high-frequency power supply 7, which acts with a magnetic field generated via a magnetic field generating coil 20 to generate plasma 3 within the processing chamber 16. A bias-applying high-frequency power supply 8 is connected via a coupling capacitor 9 to the electrode 1 on which the wafer 2 is placed, and by applying high-frequency power from this power supply, a self-bias voltage is generated to the electrode 1 through the functions mentioned above, by which the ions in the plasma 3 are attracted toward the wafer to perform etching.

An electrostatic chuck power supply 10 is connected to the electrode 1, for chucking the wafer 2 by coulomb force to the electrode via an insulating film 15. In order to prevent the wafer 2 from being heated by the plasma during etching, a cooling gas 12 is flown via the mass-flow controller 13 to the rear surface of the wafer, allowing the heat of the wafer to be transmitted toward the electrode. In order to achieve a constant cooling effect, a cooling gas pressure on the rear side of the wafer is monitored via a manometer 14 so as to control the pressure to a fixed pressure.

In an etching apparatus without an electrostatic chuck mechanism, it is possible to measure the self-bias voltage applied to the wafer 2 via a voltmeter 11 for measuring the potential of the electrode, but in the present type of electrode equipped with an electrostatic chuck mechanism, the DC component is cut by the insulating film 15, making it impossible to measure the self-bias voltage by the voltmeter.

Figure 2A:
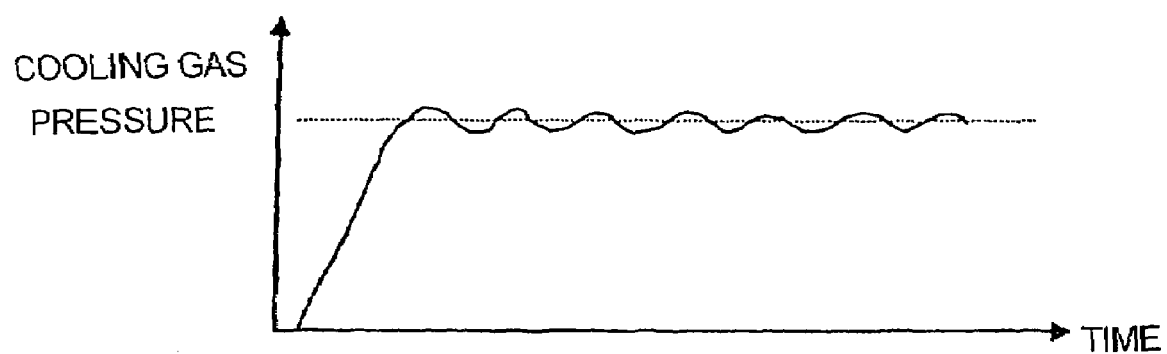
FIG. 2A is a view illustrating how the pressure of the wafer cooling gas is controlled, showing the time variation of pressure.
Figure 2B:
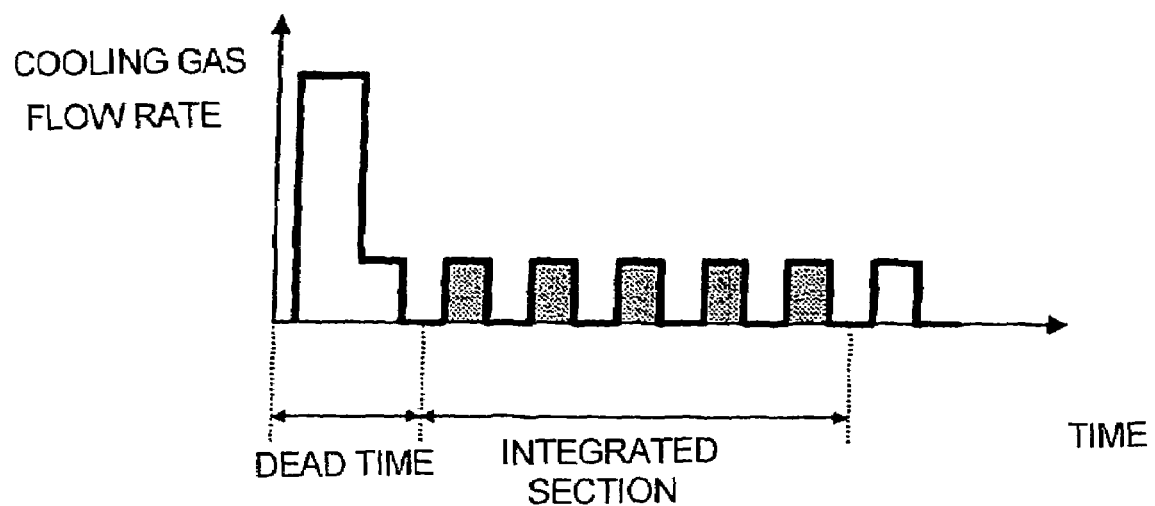
FIG. 2B is a view illustrating how the pressure of the wafer cooling gas is controlled, showing the time variation of cooling gas flow rate during control.

The method for estimating the self-bias voltage according to the present invention will now be described in detail. FIGS. 2A and 2B illustrate how the pressure of the wafer cooling gas is controlled. There are several methods for controlling the pressure of the cooling gas, and one method is taken as an example in which the cooling gas flow supplied to the rear surface of the wafer is turned on and off intermittently. FIG. 2A shows the time variation of the cooling gas pressure, and FIG. 2B shows the time variation of the cooling gas flow rate value during pressure control. During pressure control, the pressure of the cooling gas 12 is monitored via a cooling gas manometer 14 while the cooling gas is turned on and off intermittently, wherein during the period in which the pressure is steady, it is considered that the quantity of cooling gas being supplied is equal to the cooling gas quantity leaking out from the chucked surface between the electrode and the wafer.

This quantity of leak of the cooling gas varies according to the force of electrostatic chuck between the wafer 2 and the electrode 1, and the quantity of leak reduces as the force of electrostatic chuck increases.

Therefore, as shown in FIG. 2B, by setting up a dead time during which the pressure control reaches a steady state, and integrating the flow rate of the cooling gas during a certain period of time after the dead time to acquire an average flow rate during the integrated period, it becomes possible to evaluate the force of electrostatic chuck based on the average flow rate.

Figure 3:
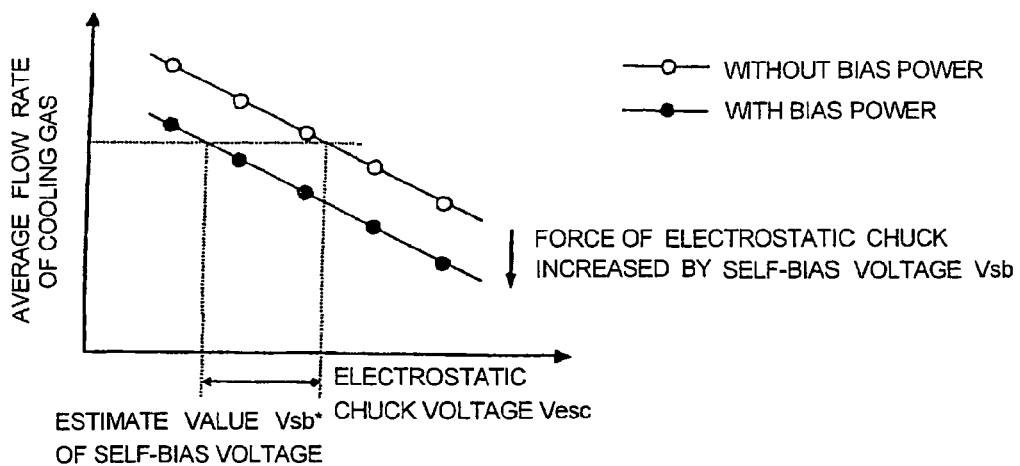
FIG. 3 is a view showing the measurements of the integrated value of cooling gas flow rate during a certain period of time excluding the initial dead time as according to FIG. 2B, which is measured while changing the electrostatic chuck voltage.

The method for estimating the self-bias voltage is described with reference to FIG. 3 showing a graph illustrating the integrated value of the cooling gas flow rate during a certain period of time excluding the initial dead time while varying the electrostatic chuck voltage. This method acquires the forces of electrostatic chuck and the electrostatic chuck voltages corresponding to the forces of electrostatic chuck for both statuses in which the bias power supply is turned on and turned off, and acquires a self-bias voltage based on the difference of electrostatic chuck voltages corresponding to the same force of electrostatic chuck. FIG. 3 shows the result of measuring the above-mentioned average flow rate (force of electrostatic chuck) with the electrostatic chuck voltages Vesc varied in multiple step-like manner. It can be seen that the average flow rate reduces as the electrostatic chuck voltage Vesc increases and the force of electrostatic chuck is enhanced. In other words, the result proves that it is possible to evaluate the force of electrostatic chuck based on the average flow rate, as assumed earlier.

FIG. 3 plots the change in average flow rate not only with the electrostatic chuck voltage Vesc varied, but with the high-frequency bias power turned on and off. As shown in this graph, by applying high-frequency bias power, the whole graph representing the cooling gas average flow rate shifts toward the reducing direction. This is considered to be caused by the self-bias voltage Vsb by high-frequency bias power being superposed to the electrostatic chuck voltage Vesc, so that the chuck is assumed to be equivalently realized by a voltage in which the self-bias voltage Vsb is added to the electrostatic chuck voltage Vesc.

Further according to the present embodiment, the electrostatic chuck voltage Vesc applies a positive voltage toward the electrode, by which the self-bias voltage Vsb operates to increase the force of electrostatic chuck. By aligning the graphs side by side in which the application of high frequency bias power are on and off, computing the electrostatic chuck voltages Vesc in which the average flow rate are the same, and calculating the differences thereof, the obtained value equals the self-bias voltage Vsb. Based on the procedure described above, an estimated value Vsb* of the self-bias voltage Vsb is computed.

Next, we will describe a case in which the number of substrates being etched in the etching apparatus is increased and the atmosphere inside the processing chamber is varied from the initial atmosphere. As the number of substrates subjected to etching increases, reaction products adhere on the inner wall surfaces of the processing chamber or the surface of electrodes and so on. The atmosphere within the processing chamber is changed by the adhered particles and outgases or the like generated from the particles, causing the plasma impedance to vary and the self-bias voltage to be changed from the initial value.

Since the self-bias voltage is an important factor for the etching process, as mentioned earlier, the change of the self-bias voltage may cause deterioration of the performance of the apparatus. Therefore, in order to maintain the performance of the etching process, it becomes possible to measure or monitor the self-bias voltage when the number of substrates subjected to etching increases. However, according to the prior art method for measuring the voltage for the electrode without an insulating film, the voltage of the present etching apparatus cannot be measured since the actual environment of use cannot be reproduced.

Figure 4:
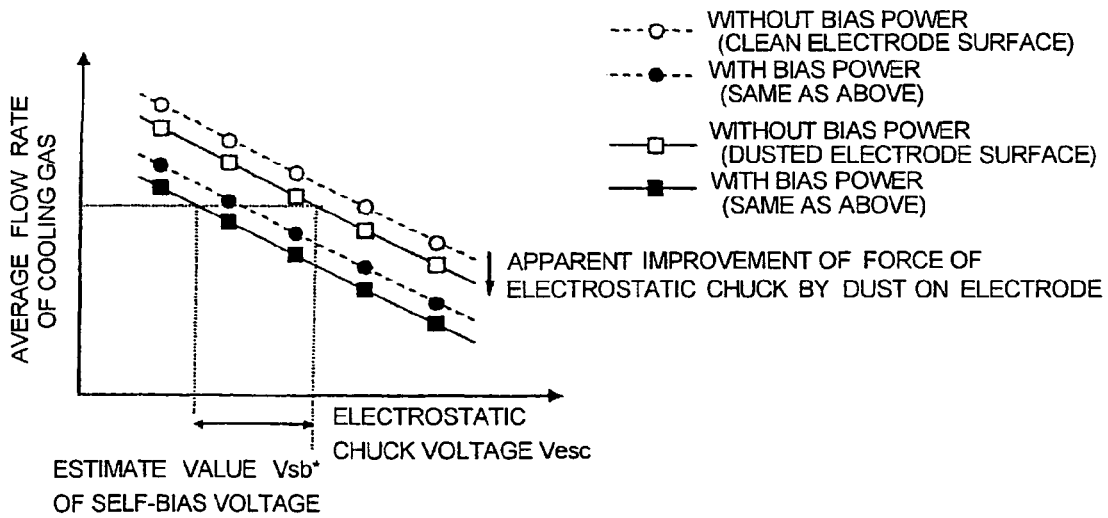
FIG. 4 is a view illustrating the properties of electrostatic chuck when reaction products are attached to the inner side of the processing chamber by the increase in the number of substrates being etched and the etching atmosphere is changed thereby.

How the property of the force of electrostatic chuck changes when the etching atmosphere is changed by adhesion of reaction products in the processing chamber due to the increase in the number of substrates being etched depends on the reaction products, but the change in chamber atmosphere can be cancelled by computing the self-bias voltage based on the relative difference of voltages when the bias power is turned on and off. FIG. 4 shows the operation of the present invention applied to the state in which the atmosphere within the processing chamber has changed. In the drawing, the broken lines represent the property of the force of electrostatic chuck in which the atmosphere in the processing chamber is clean, and the solid lines represent the property of the force of electrostatic chuck in which reaction products are adhered to the processing chamber. When reaction products are adhered to the interior of the processing chamber 16, the surface of the electrode 1 supporting the wafer is also dusted with reaction products, and these reaction products may fill the space formed between the wafer 2 and the electrode 1, by which the sealing property is sometimes improved. Thereby, when the electrode is dusted, the quantity of leak of cooling gas is reduced, and it may seem as if the force of electrostatic chuck is improved apparently as shown in FIG. 4.

Since according to the present invention, the self-bias voltage Vsb is computed from the relative difference in forces of electrostatic chuck when the bias power is turned on and off, so the self-bias voltage Vsb can be estimated even when the atmosphere within the processing chamber 16 is varied.

Figure 5:
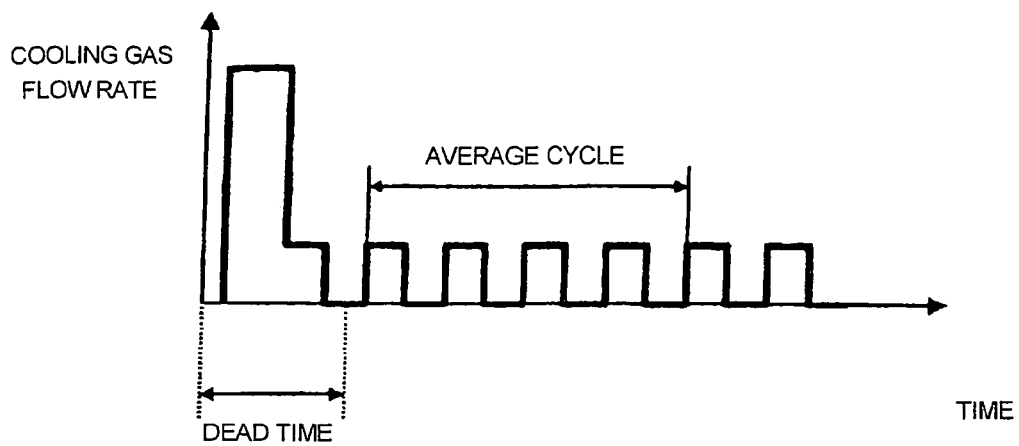
FIG. 5 is an explanatory view showing how the property of electrostatic chuck can be acquired from cooling gas control cycles.

According to the above procedure, it is not necessary to compute the absolute value of the measurement of the force of electrostatic chuck, and it is only necessary to compute a value functioning as an indicator capable of relatively comparing the force of electrostatic chuck. Therefore, the electrostatic chuck property can be computed from the control cycles, instead of the integrated value of cooling gas as illustrated in FIG. 2. In other words, it is possible to obtain an indicator of the force of electrostatic chuck by measuring the control cycles as illustrated in FIG. 5.

Figure 6:
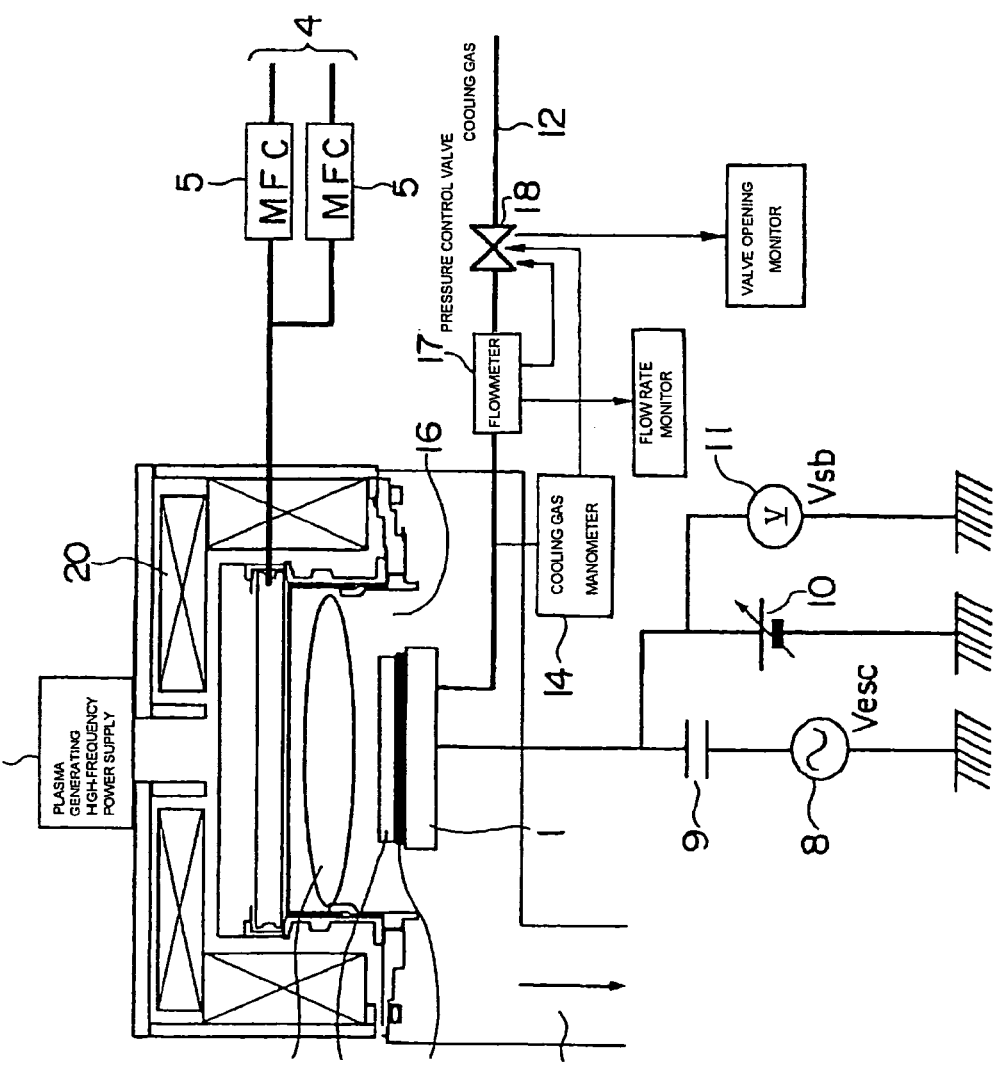
FIG. 6 is an explanatory view showing the case in which the property of the force of electrostatic chuck is controlled via the pressure control valve of the cooling gas.

Furthermore, the pressure of the cooling gas can also be controlled not through the flow rate but through the pressure of the cooling gas. When the pressure is controlled via a pressure control valve; the force of electrostatic chuck can be acquired for example by disposing a cooling gas flowmeter or by monitoring the opening of the valve and the like. FIG. 6 illustrates an arrangement in which the pressure on the rear surface of the wafer 2 is controlled, not via intermittent control of cooling gas as mentioned above, but via a pressure control valve 18 based on the values detected by a cooling gas manometer 14 and a flowmeter 17. Also according to this example, the relative force of electrostatic chuck can be acquired by monitoring the flow rate by disposing the flowmeter 17 on the supply path of the cooling gas 12 as illustrated, or by monitoring the opening of the pressure control valve 18.

Figure 7:
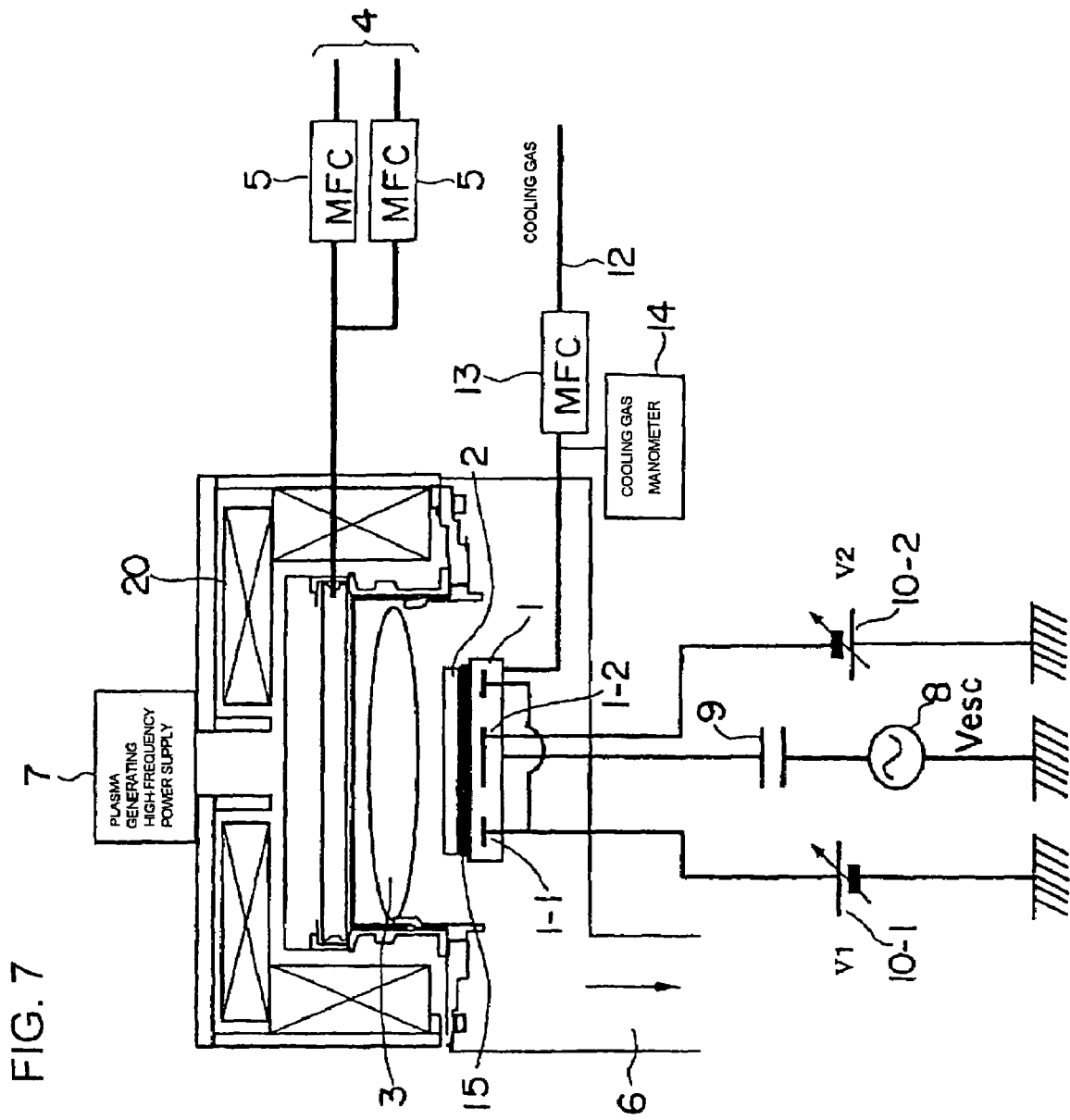
FIG. 7 is a view illustrating the outline of a dipole-type electrostatic chuck mechanism.

Furthermore, one method for realizing electrostatic chuck is a dipole method in which different voltages are applied respectively to the outer side and the inner side of the wafer, as illustrated in FIG. 7. According to this method, as illustrated in FIG. 7, a +V1 voltage is applied to the outer chuck electrode 1-1 and a −V2 voltage is applied to the inner chuck electrode 1-2, according to which the charges within the wafer 2 are polarized, causing the forces of electrostatic chuck to occur corresponding to the respectively applied voltages V1 and V2 to the outer chuck electrode 1-1 and the inner chuck electrode 1-2.

When bias power is applied in this state with positive and negative voltages applied, the self-bias voltage Vsb is added to the electrostatic chuck voltage V1 and the force of electrostatic chuck increases at the outer chuck electrode 1-1, but the self-bias voltage Vsb operates to cancel the voltage −V2, so the force of electrostatic chuck decreases at the inner electrode 1-2.

As described above, according to the dipole method, the balance of the force of electrostatic chuck is disrupted when the bias is turned on and off, so the self-bias voltage will not have the characteristics illustrated in FIG. 3, and the self-bias voltage Vsb cannot be measured if nothing is done.

Figure 8:
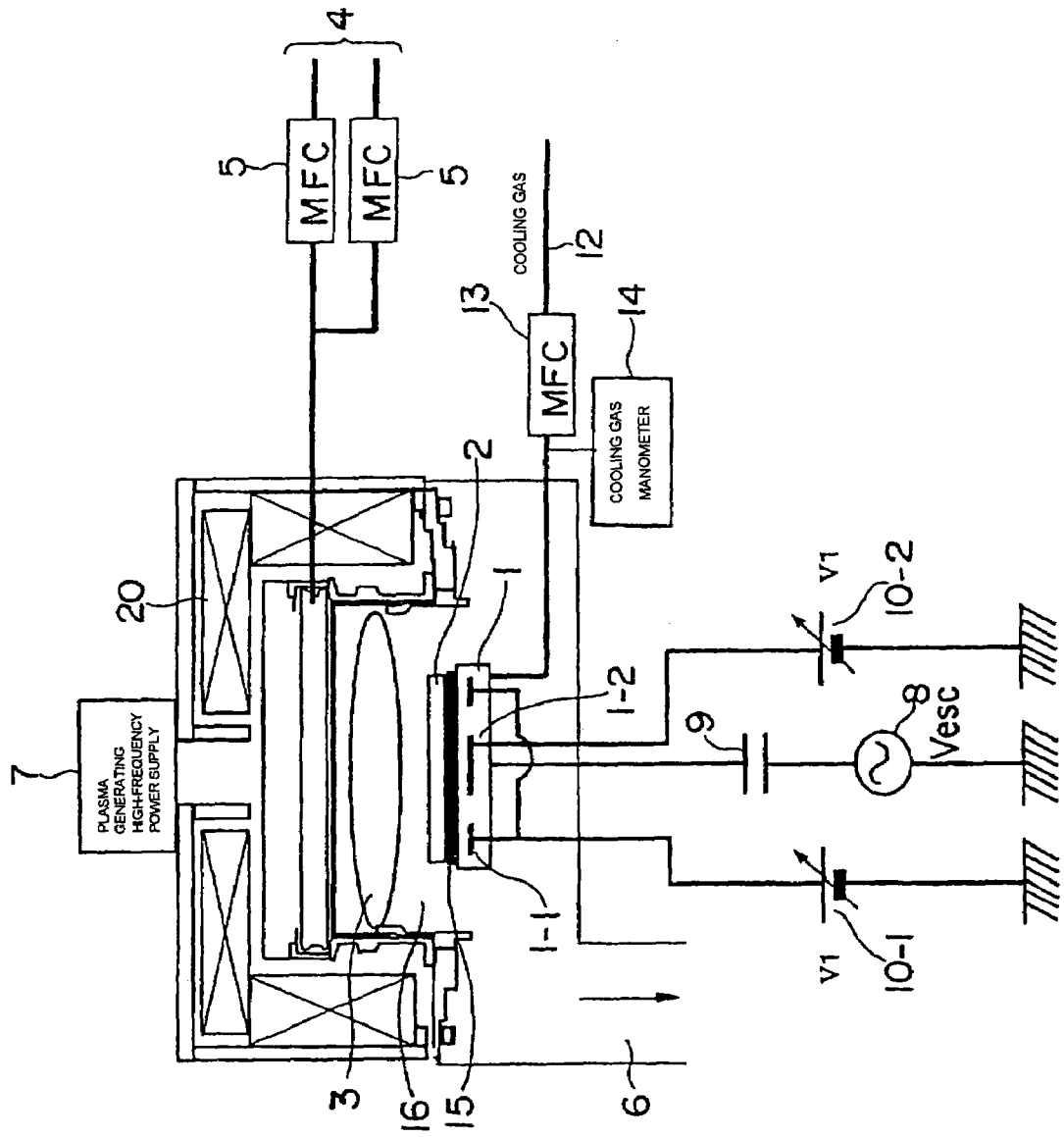
FIG. 8 is an explanatory view showing how the dipole-type mechanism becomes equivalent to the arrangement of FIG. 1.

If such dipole method is adopted in the electrostatic chuck, by setting the outer and inner electrodes to have the same voltage and the same polarity, the chuck mechanism can be made equivalent to that illustrated in FIG. 1. Therefore, by setting the outer chuck electrode 1-1 and the inner chuck electrode 1-2 to have the same voltage V1 and the same polarity, as illustrated in FIG. 8, the arrangement becomes equivalent to that illustrated in FIG. 1, and the self-bias voltage Vsb can be estimated by the procedures described earlier.

According to the above-mentioned method for measuring self-bias voltage, by setting the measurement recipe to fall within the recipe of wafer processing, the measurement can be completed by executing the recipe only once. Therefore, by processing a dummy wafer via the measurement recipe arbitrarily during operation of the etching apparatus, it becomes possible to check the variation of property with time of the etching apparatus.

As described, by measuring the self-bias voltage Vsb, it becomes possible to capture the transition of the status of the etching apparatus during operation, and by taking measures when the apparatus is malfunctioning such as outputting an alarm or stopping the operation of the apparatus, it becomes possible to suppress product defects from occurring.

Moreover, since the self-bias voltage Vsb can be estimated easily for process conditions with an unknown self-bias voltage Vsb during process development, the present invention contributes to improving the efficiency of process development.

What is claimed is:

1. A method for measuring self-bias voltage in an etching apparatus comprising an electrostatic chuck mechanism for chucking a sample, a mechanism for filling a cooling gas to a rear surface of the sample subjected to electrostatic chuck and controlling the pressure of the cooling gas, and a means for measuring a relative force of electrostatic chuck of the sample based on a status of control of the rear surface pressure of the sample during processing, the method comprising the steps of:

acquiring the relative force of electrostatic chuck of the sample and the electrostatic chuck voltage corresponding to the force of electrostatic chuck based on the status of control of the rear surface pressure of the sample when high-frequency bias power is applied to the sample during processing;

acquiring the relative force of electrostatic chuck of the sample and the electrostatic chuck voltage corresponding to the force of electrostatic chuck based on the status of control of the rear surface pressure of the sample when high-frequency bias power is not applied to the sample during processing; and estimating the self-bias voltage applied to the sample via the high-frequency bias power using the acquired forces of electrostatic chuck and the electrostatic chuck voltages corresponding to the forces of electrostatic chuck of both of the status of control when the high-frequency bias power is applied to the sample during processing and the status of control when the high-frequency bias power is not applied to the sample during processing.

2. The method for measuring self-bias voltage according to claim 1, wherein the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

3. The method for measuring self-bias voltage according to claim 1, wherein the steps of acquiring the relative force include acquiring the force of electrostatic chuck for chucking the sample by the electrostatic chuck mechanism based on the flow rate of the cooling gas supplied to the rear surface of the sample.

4. The method for measuring self-bias voltage according to claim 1, wherein the steps of acquiring the relative force include acquiring the force of electrostatic chuck of the sample by the electrostatic chuck mechanism based on the flow rate of the cooling gas supplied to the rear surface of the sample; and the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

5. The method for measuring self-bias voltage according to claim 1, wherein the steps of acquiring the relative force includes acquiring the force of electrostatic chuck for chucking the sample by the electrostatic chuck mechanism based on the pressure of the cooling gas supplied to the rear surface of the sample.

6. The method for measuring self-bias voltage according to claim 1, wherein the steps of acquiring the relative force include acquiring the force of electrostatic chuck for chucking the sample by the electrostatic chuck mechanism based on the pressure of the cooling gas supplied to the rear surface of the sample; and the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

7. A method for monitoring an etching apparatus comprising an electrostatic chuck mechanism for chucking a sample, a mechanism for filling a cooling gas to a rear surface of the sample subjected to electrostatic chuck and controlling the pressure of the cooling gas, and a means for measuring a relative force of electrostatic chuck of the sample based on a status of control of the rear surface pressure of the sample during processing, the method comprising the steps of:

acquiring the relative force of electrostatic chuck of the sample and the electrostatic chuck voltage corresponding to the force of electrostatic chuck based on the status of control of the rear surface pressure of the sample when high-frequency bias power is applied to the sample during processing;

acquiring the relative force of electrostatic chuck of the sample and the electrostatic chuck voltage corresponding to the force of electrostatic chuck based on the status of control of the rear surface pressure of the sample when high-frequency bias power is not applied to the sample during processing;

estimating the self-bias voltage applied to the sample via the high-frequency bias power using the acquired forces of electrostatic chuck and the electrostatic chuck voltages corresponding to the forces of electrostatic chuck of both of the status of control when the high-frequency bias power is applied to the sample during processing and the status of control when the high-frequency bias power is not applied to the sample during processing; and acquiring a plurality of estimated self-bias voltages of the sample, and monitoring the status of the etching apparatus based on a transition thereof.

8. The method for monitoring the etching apparatus according to claim 7, wherein the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

9. The method for monitoring the etching apparatus according to claim 7, wherein the steps of acquiring the relative force include acquiring the force of electrostatic chuck of the sample by the electrostatic chuck mechanism based on the flow rate of the cooling gas supplied to the rear surface of the sample; and the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

10. The method for monitoring the etching apparatus according to claim 7, wherein the steps of acquiring the relative force include acquiring the force of electrostatic chuck for chucking the sample by the electrostatic chuck mechanism based on the pressure of the cooling gas supplied to the rear surface of the sample; and the step of estimating the self-bias voltage includes computing the difference between electrostatic chuck voltages at a point where the acquired forces of electrostatic chuck are equal for both of the status of control when the high-frequency bias power is applied to the sample during processing and the status of control when the high-frequency bias power is not applied to the sample during processing.

11. An etching apparatus comprising:

an electrostatic chuck mechanism for chucking a sample;

a mechanism for filling a cooling gas to a rear surface of the sample subjected to electrostatic chuck and controlling the pressure thereof;

a means for acquiring a relative force of electrostatic chuck of the sample and the electrostatic chuck voltage corresponding to the force of electrostatic chuck based on a status of control of the rear surface pressure of the sample when a high-frequency bias power is applied to the sample during processing and for acquiring a relative force of electrostatic chuck of the sample and the electrostatic chuck voltage corresponding to the force of electrostatic chuck based on a status of control of the rear surface pressure of the sample when the high-frequency bias power is not applied to the sample during processing; and a means for estimating the self bias voltage applied to the sample via the high-frequency bias power, using the electrostatic chuck voltages corresponding to the same force of electrostatic chuck respectively acquired by applying high-frequency bias power to the sample and acquired by not applying high-frequency bias power thereto.

12. The etching apparatus according to claim 11, comprising:

a means for monitoring the status of the etching apparatus based on a transition of self-bias voltages respectively estimated for a plurality of samples.

* * * * *